(12) United States Patent
Kim (10) Patent No.: US 9,386,711 B2
(45) Date of Patent: Jul. 5, 2016

(54) DISPLAY DEVICE WALL MOUNTING APPARATUS

(71) Applicant: LG ELECTRONICS INC., Seoul (KR)

(72) Inventor: Chanwoo Kim, Pyeongtaek-si (KR)

(73) Assignee: LG ELECTRONICS INC., Seoul (KR)

( * ) Notice: Subject to any disclaimer, the term of this patent is extended or adjusted under 35 U.S.C. 154(b) by 208 days.

(21) Appl. No.: 13/934,874

(22) Filed: Jul. 3, 2013

(65) Prior Publication Data
US 2014/0016292 A1 Jan. 16, 2014

(30) Foreign Application Priority Data
Jul. 12, 2012 (KR) ........................ 10-2012-0075875

(51) Int. Cl.
| | |
|---|---|
| *H05K 5/02* | (2006.01) |
| *G09F 7/22* | (2006.01) |
| *G09F 9/30* | (2006.01) |
| *G09F 9/33* | (2006.01) |
| *G09F 7/18* | (2006.01) |

(52) U.S. Cl.
CPC ................ *H05K 5/0204* (2013.01); *G09F 7/18* (2013.01); *G09F 7/22* (2013.01); *G09F 9/30* (2013.01); *G09F 9/33* (2013.01)

(58) Field of Classification Search
CPC ....... H05K 5/0204; G09F 9/30; G09F 1/1601; H05N 5/655; G06F 1/1607
USPC ........................................................ 361/809
See application file for complete search history.

(56) References Cited

U.S. PATENT DOCUMENTS

| | | | | |
|---|---|---|---|---|
| 4,083,525 A * | 4/1978 | Rath | .................... | A47G 1/1613 248/224.8 |
| 4,437,639 A * | 3/1984 | Stein | ..................... | F16M 13/02 248/489 |
| 4,591,125 A * | 5/1986 | Bellehumeur | ....... | A47G 1/1606 248/476 |
| 6,454,235 B1 * | 9/2002 | O'Banion | ............ | A47G 1/1606 248/495 |
| 7,134,635 B2 * | 11/2006 | Burriel et al. | ................ | 248/500 |
| 7,891,124 B1 * | 2/2011 | Willis | .................. | A47G 1/1606 248/477 |
| 8,313,068 B2 * | 11/2012 | Park et al. | .................. | 248/205.1 |
| 2009/0294599 A1 * | 12/2009 | Chen et al. | ...................... | 248/65 |
| 2011/0063789 A1 * | 3/2011 | Ma et al. | .................. | 361/679.21 |

(Continued)

FOREIGN PATENT DOCUMENTS

| | | |
|---|---|---|
| JP | 10-061619 A | 3/1998 |
| JP | 2011-237626 A | 11/2011 |

(Continued)

OTHER PUBLICATIONS

International Search Report and Written Opinion dated Aug. 28, 2013 issued in Application No. PCT/KR2013/005181.

*Primary Examiner* — Hoa C Nguyen
*Assistant Examiner* — Keith Depew
(74) *Attorney, Agent, or Firm* — Ked & Associates, LLP (57) ABSTRACT

There are disclosed a display device including a display module configured to display a screen, a case configured to mount the display module therein, a mount plate coupled to a back surface of the case, with a lower portion comprising an arch-shaped handle having a predetermined curvature, and a mount fixer fixed to a wall, the mount fixer comprising a seating portion having the same curvature as the handle, such that an installation angle can be changed to make the display device leveled even after the mount device is installed so as to relieve difficulty in leveling the display device when it is mounted to the wall.

8 Claims, 5 Drawing Sheets

(56) References Cited

U.S. PATENT DOCUMENTS

| | | | |
|---|---|---|---|
| 2011/0292581 A1* | 12/2011 | Lin et al. | 361/679.21 |
| 2012/0050958 A1* | 3/2012 | Sanford et al. | 361/679.01 |
| 2013/0002517 A1* | 1/2013 | Pascolini et al. | 343/878 |
| 2013/0083507 A1* | 4/2013 | Guirlinger | 361/809 |

FOREIGN PATENT DOCUMENTS

| | | |
|---|---|---|
| KR | 10-2009-0072724 A | 7/2009 |
| KR | 10-0988713 B1 | 10/2010 |
| KR | 10-2011-0054202 A | 5/2011 |

\* cited by examiner

DISPLAY DEVICE WALL MOUNTING APPARATUS

Pursuant to 35 U.S.C. §119(a), this application claims the benefit of earlier filing date and right of priority to Korean Application No.10-2012-0075875, filed on Jul. 12, 2012, the contents of which are hereby incorporated by reference herein in their entirety.

BACKGROUND OF THE DISCLOSURE

1. Field of the Disclosure

The present invention relates to a wall mount type display device, more particularly, to a wall mount type display device including a mount fixer and a mount plate to ease a wall mounting process thereof.

2. Discussion of the Related Art

Recently, various flat panel type display devices capable of reducing the weight and volume that is disadvantages of cathode ray tube type display devices are emerged as main display devices. Such a display device can be classified into Liquid Crystal Displays (LCD), Field Emission Display (FED), Plasma Display Panels (PDP) and Organic Electro Luminescence Diode (OELD).

The flat panel display device is coupled to a case. In the case are mounted a power supply unit configured to provide a power necessary to drive electronic devices and a circuit device configured to process information and electronic components configured to drive the flat panel display.

The display device can be categorized into a stand type mounted on a shelf or floor and a wall mount type mounted to a wall. A mount device used in fixedly mounting the display device to an installation surface is coupled to a back surface of the case and the mount device supports the display device. A conventional mount device has a complex structure and complex installation method. Also, the conventional mount device occupies quite an installation space and it has a low spatial utilization.

Once it is fixed, the wall mount type display device cannot be moved and it is very important to maintain level in the wall mount type display device but it is not easy to maintain the level. In addition, an inclinometer provided in the mount device to maintain the level will be used once. The conventional mount device having the inclinometer has a disadvantage of resource waste.

SUMMARY OF THE DISCLOSURE

To overcome the disadvantages, an object of embodiments herewith is to provide a display device including a mount device that is able to maintain level by changing an installation angle after installing the display device.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a display module configured to display a screen; a case configured to mount the display module therein; a mount plate coupled to a back surface of the case, with a lower portion comprising an arch-shaped handle having a predetermined curvature; and a mount fixer fixed to a wall, the mount fixer comprising a seating portion having the same curvature as the handle.

The length of the mount fixer may be smaller than the length of the handle.

The mount fixer may include a rear bracket coupled to the wall; a front bracket coupled to a front surface of the rear bracket, with a lower end coupled to the rear bracket and an upper end spaced apart a predetermined distance from the rear bracket; and the seating portion formed in the gap between the front bracket and the rear bracket.

The mount fixer may further include a top bracket slidably coupled to a top end of the rear bracket, the top bracket configured to slide toward the front bracket to cover an upper portion of the seating portion.

The mount fixer may further include a frictional member provided in a front or rear portion of the seating portion to prevent the handle from slipping.

A middle or lower portion of the frictional member may be projected more than an upper portion.

The case may further include a control box arranged on a back surface of the case, wherein the mount plate is coupled to an upper end of the control box.

The distance between the seating portion and the wall may be the same as the thickness of the control box from a position coupled to the mount plate to a back surface.

The display device may further include a rubber provided on a back surface of the control box, the rubber configured to contact with the wall when the mount fixer and the mount plate are coupled to each other.

The display module may include an organic light emitting diode (OLED).

The display device according to the embodiments an installation angle can be changed to make the display device leveled even after the mount device is installed. Accordingly, the difficulty in leveling the display device when it is mounted to the wall can be relieved.

Furthermore, the structure of the mount device can be simple and the number of the parts can be reduced. Accordingly, the installation process can be simple and the time taken to install the display device to the wall can be reduced.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

DESCRIPTION OF SPECIFIC EMBODIMENTS

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

Figure 1:
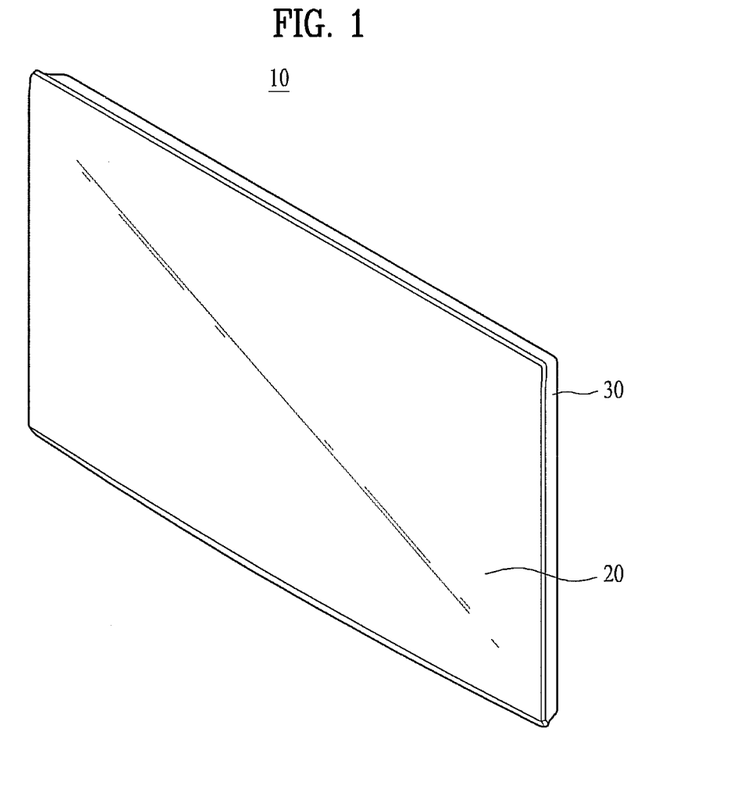
FIG. 1 is a front diagram illustrating a display device according to one embodiment of the present invention.
Figure 2:
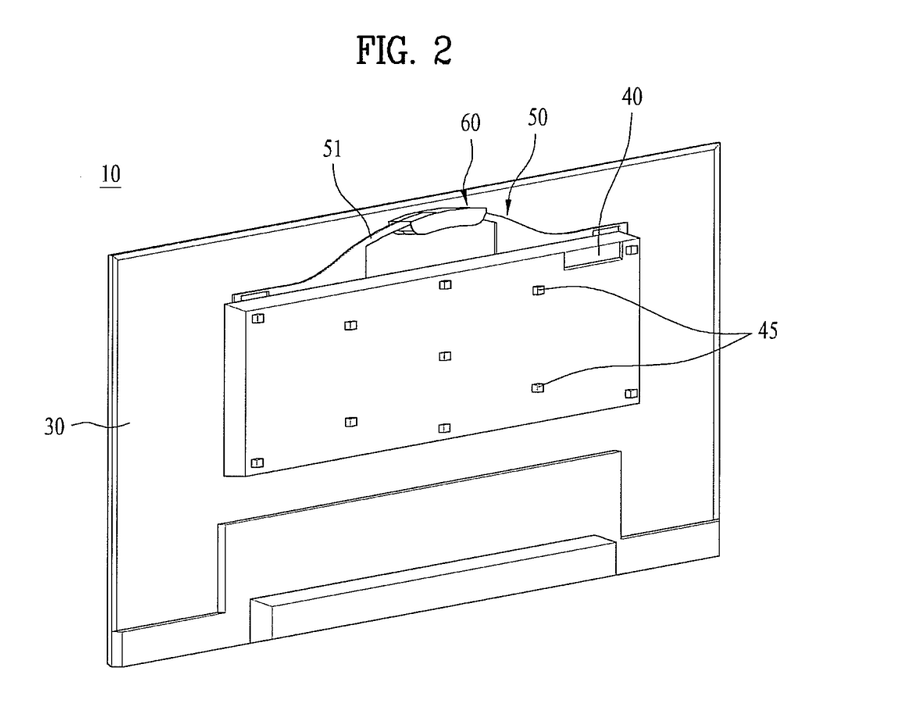
FIG. 2 is a rear diagram illustrating the display device according to one embodiment of the present invention.

FIG. 1 is a front diagram illustrating a display device 10 according to one embodiment of the present invention. FIG. 2 is a rear diagram illustrating the display device 10 according to one embodiment of the present invention. The display device 10 according to the present invention includes a display module, case 30, a mount plate 50 and a mount fixer 60.

The display module 20 has pixels aligned in such a matrix type as Liquid Crystal Display (LCD), Plasma Display Panel (PDP), Field Emission Display (FED) and Organic Electro-Luminescence Diode (OLED).

Especially, Organic Electro-luminescence Diode (OLED) is a self luminescent device that makes a phosphor luminescent by re-combining an electron with a hole. Typically, in the Organic Electro-luminescent Diode may be provided an electron injection layer disposed between a cathode and an anode, an electron transfer layer, a light-emitting layer, a hole transfer layer and a hole injection layer.

When a predetermined voltage is applied between a cathode and an anode of the Organic Electro-luminescence Diode (OELD), electrons generated in the anode are transferred to the light emitting layer via the electron injection layer and the electron transfer layer and holes generated in the cathode and anode are transferred to the light emitting layer via the hole injection layer and the hole transfer layer. After that, the electron and the hole transferred from the electron transfer layer and the hole transfer layer, respectively can be recombined with each other and lights are emitted in the light emitting layer.

The OELD can be driven in low voltages and reduce power consumption. Also, the OELD have other advantages of self-luminescence, a wide viewing angle, a rapid response speed and a high contrast. Accordingly, it is expected that the OELD will be the next generation display device.

Especially, the OLED is a thin film type and it can reduce the weight such that the force supported by the mount device may be relatively small enough to make the structure of the mount device simple.

The case 30 may include a front case 30 for covering a front side of the display device 10 and a rear case 30 for covering a back side of the display device 10. Recently have been used a display module 20 having a size of bezel that is approximately zero and such a display module 20 includes only a middle case for covering a lateral side of the display device and a rear case for covering a back side of the display device. According to one embodiment, the display device is coupled to at least one of the front and rear cases to cover the display module 20.

Electronic components may be arranged in the case 30. The rear case may be provided in close contact with the display module 20 and an auxiliary control box 40 may be provided. In the control box 40 may be mounted a power supply unit provided to drive the display device 10 and a controller configured to convert an electrical signal input from the outside into an audio or video signal to output the converted audio or image signal to the display device 10.

When the auxiliary control box 40 is provided, it is not necessary to make the case thick and it is possible to make an edge portion of the display module 20 thin, such that the display device 10 can be made thin.

The mount device is configured to fixedly mount the display device 10 to a wall. Such the mount device includes a mount plate 50 coupled to a back surface of the display device 10 and a mount fixer 60 fixed to the wall.

The mount plate 50 is coupled to a back surface of the case 30 and it includes a handle 51 formed in an arch shape having a lower portion with a predetermined curvature. The handle 51 is coupled to the mount fixer 60 fixed to the wall. The display device 10 may be fixedly mounted to the wall, as a lower surface of the handle 51 and an upper surface of a seating portion 63 provided in the mount fixer 60.

The mount plate 50 has to support the weight of the display device 10 and it may be formed of a special material. Accordingly, examples of such a special material include steel, carbon reinforced fiber and so on. The handle 51 is predeterminedly thick enough not to be deformed by the weight of the display device 10, when supporting the weight of the display device 10. In case of the OELD 10 mentioned above, the weight is relatively small and the handle 51 can be thinner.

Figure 3:
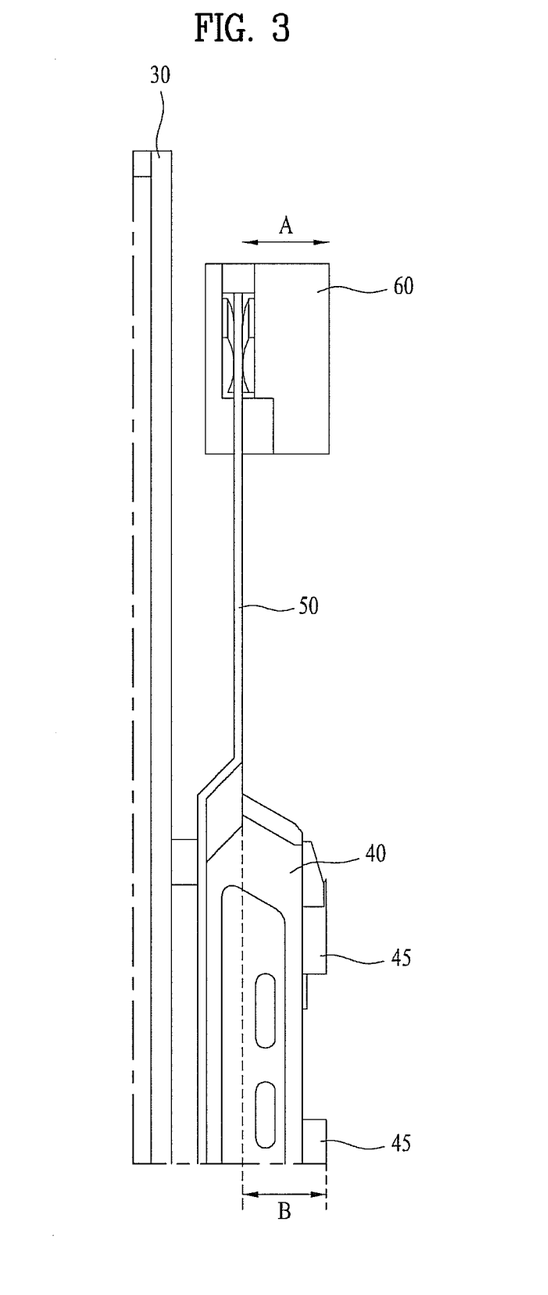
FIG. 3 is a side diagram illustrating the display device according to one embodiment of the present invention.

As shown in FIG. 3, the handle 51 of the mount plate 50 is spaced apart a predetermined distance from the case 30. That is because a spaced gap has to be formed to hang the mount plate 50 on the mount fixer 60. Accordingly, the mount plate 50 may be coupled to the case 30 via a lower surface of the handle 51. At this time, the handle 51 may be spaced apart from the case 30.

More specifically, as shown in FIGS. 2 and 3, a lower end of the mount plate 50 is coupled to an upper end of the control box 40 arranged in the back surface of the case 30, to fix the mount plate 50 to the case 30.

The mount fixer 60 is fixed to the wall and it has a seating portion 63 having a predetermined curvature that is identical to the curvature of the handle 51. The seating portion 63 of the mount fixer 60 has the same curvature as the handle 51 of the mount plate 50, such that an angle of the display device 10 can be changed in a predetermined range even after the mount fixer 60 is fixed.

Figure 4:
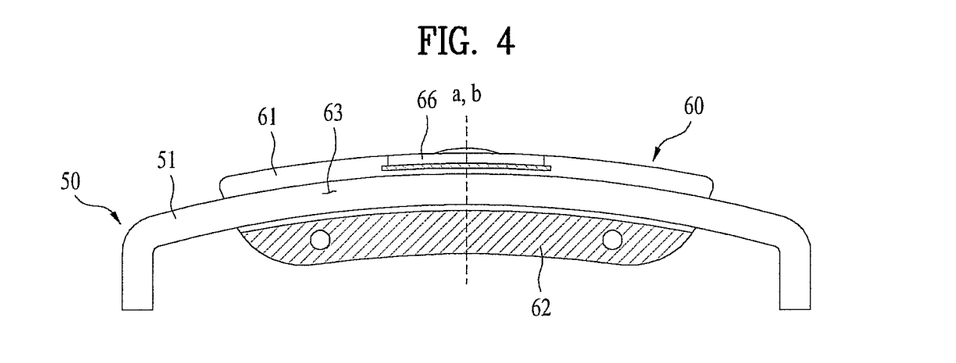
FIGS. 4 and 5 are diagrams illustrating a coupling process between a mount fixer and a mount plate provided in the display device according to one embodiment of the present invention.

As shown in FIG. 4, the mount fixer 60 is mounted to the wall, with maintaining level, and a center (a) of the mount plate 50 is seated in a center (b) of the mount fixer 60 correspondingly. After that, the display device 10 may be leveled out.

However, in case the mount fixer 60 is mounted to the wall inclinedly and a center of the seating portion 63 provided in the mount fixer 60 is fitted to a center of the handle 51 provided in the mount plate 50. After that, the display device 10 will be mounted to the wall inclinedly.

Figure 5:
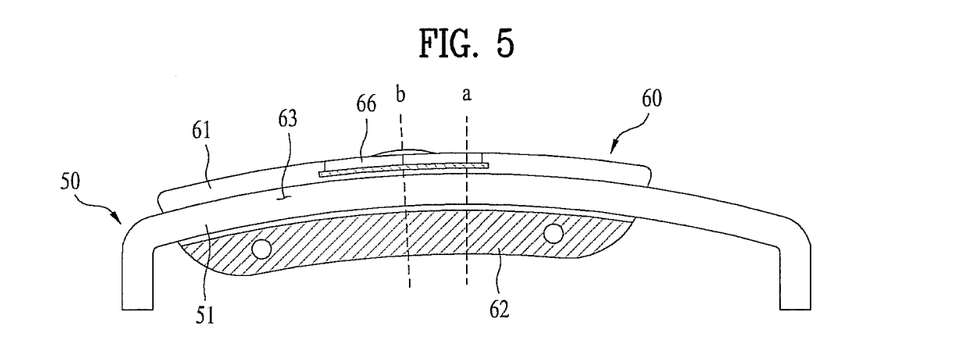

According to the present invention, the upper surface of the seating portion 63 has the same curvature as the lower surface of the handle 51. Even when the mount fixer the seating portion 63 is fitted to the handle 51 as shown in FIG. 5, the upper surface of the seating portion 63 is in close contact with the lower surface of the handle 51 to fix the display device 10 to the wall stably.

Even after the handle 51 is insertedly fitted to the seating portion 63 in case of using the mount fixer 60 and the mount plate 50 mentioned above, the display device 10 can be tilted rightward and leftward to be leveled. In other words, as shown in FIGS. 4 and 5, the handle 51 is longer than the mount fixer 60 to make the display device 10 tilted rightward and leftward.

Figure 6:
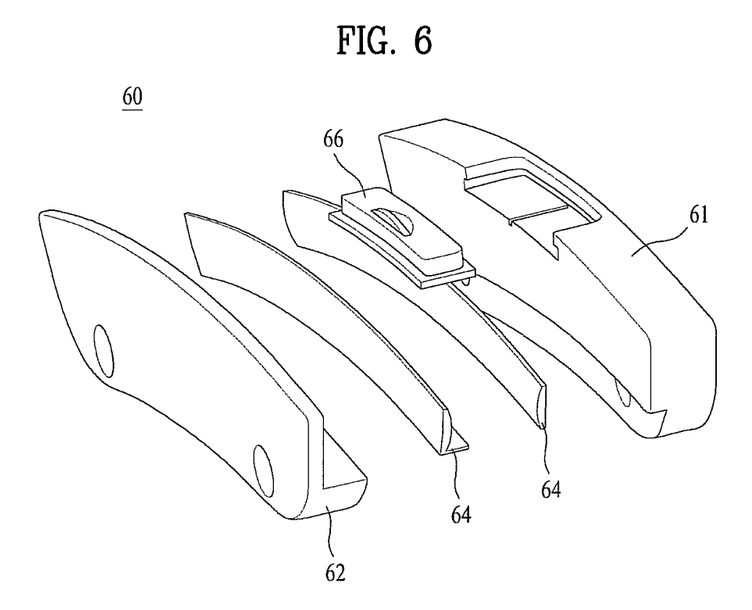
FIG. 6 is an exploded perspective diagram illustrating a mount fixer of the display device according to one embodiment of the present invention.

As shown in FIG. 6, the mount fixer 60 includes a rear bracket 61, a front bracket 62, the seating portion 63, a top bracket 66 and a frictional member 64.

The rear bracket 61 is coupled to the wall and a hole is formed in the rear bracket 61 to pass a screw there through as shown in the drawing. Accordingly, the mount fixer 60 may be coupled to the wall by passing the screw through the hole. The mount fixer 60 has at least two portions where screws are fastened. In case one screw is fastened to fix the mount fixer, the mount fixer 60 might rotate.

The front bracket 62 is coupled to a lower end of a front surface composing the rear bracket 61 and an upper end of the front bracket is spaced apart from the rear bracket. The seating portion 63 is formed in a gap between the front bracket 62 and the rear bracket 61 and the handle 51 of the mount plate 50 is insertedly seated in the seating portion 63 to couple the mount plate 50 to the mount fixer 60.

The front bracket 62 and the rear bracket 61 are configured to support the weight of the display device 10. It is preferred that the front bracket and the rear bracket 61 have a predetermined strength. At this time, the brackets might be thicker than the mount plate 50 and the brackets 62 and 61 may be formed of a material having a lower strength than a material of the mount plate 50 does, for example, aluminum.

As mentioned above, the upper surface of the seating portion 63 has the same curvature as the handle 51 has. Even if the handle 51 is tilted within a predetermined range, the mount plate may be coupled to the mount fixer 60 as shown in FIG. 5. FIG. 6 shows that the lower end of the front bracket 62 is projected and coupled to the rear bracket 61 and it seems that the seating portion 63 is formed by the front bracket 62. In contrast, the lower end of the rear bracket 61 is projected forward and coupled to the lower end of the front bracket 62. Even in this instance, the seating portion 63 is formed by the rear bracket 61.

The space of the seating portion 63, in other words, a distance between the front bracket 62 and the upper end of the front bracket has to be wide enough to insert the handle 51 therein, such that the width of the seating portion 63 may be larger than the thickness of the handle 51.

The frictional member 64 may be further provided to seat the handle 51 in the seating portion 63 more stably as shown in FIG. 6. The frictional member 64 may be provided in each of front and rear portions of the seating portion 63, in other words, in front bracket 62 and the rear bracket 61, or it may be provided in the front or the rear portion of the seating portion 63.

The frictional member 64 is configured to prevent the display device 10 from being tilted rightward and leftward easily, when the handle 51 is insertedly seated in the seating portion 63. Such a frictional material as rubber is used in pressing the handle 51 with a friction force, when the handle 51 is inserted. In other words, the frictional member 64 may be formed of silicon or rubber having friction and elasticity.

Especially, when a middle portion of the frictional member is formed convex to be more projected than an upper portion as shown in FIGS. 3 and 6, it is easy to insert the handle 51 in the seating portion and the handle 51 is prevented from coming off or moving rightward and leftward easily. In the drawings, only the middle portion is projected and a lower portion may be projected.

The top bracket 66 is coupled to the upper end of the rear bracket 61 and it is sliding toward the front bracket 62 to cover the upper portion of the seating portion 63. That is to prevent the handle 51 from coming off from the seating portion 63. In case an external shock is applied to the display device 10 while it is used, the display device 10 might fall down disadvantageously with no top bracket 66.

Figure 7:
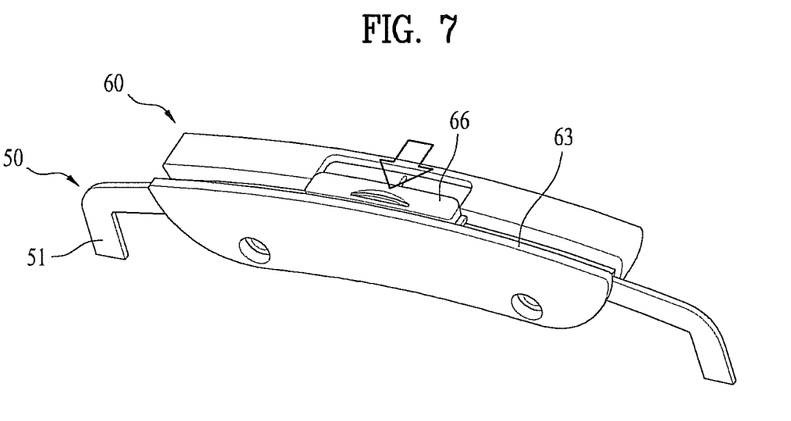
FIG. 7 is a perspective diagram illustrating a coupled state between the mount fixer and the mount plate of the display device according to one embodiment of the present invention.

When the handle 51 is inserted in the seating portion 63, the top bracket 66 is positioned on the rear bracket 61. After the handle 51 is inserted in the seating portion 63, the top bracket 66 is sliding toward the front bracket 62 from the rear bracket 61 as shown in FIG. 7, such that the top bracket 66 may be coupled to the front bracket 62 to cover the upper portion of the seating portion 63.

FIG. 3 is a side diagram illustrating the display device according to one embodiment of the present invention, when the mount fixer 60 is coupled to the mount plate 50. The distance spaced apart from a wall surface of the seating portion 63 is corresponding to the thickness of the rear bracket 61 and the thickness of the frictional member 64 near the rear bracket 61. At this time, the thickness (A) from the position of the control box 40 where the mount plate 50 is coupled to the a back surface may be the same as the distance (B) from the wall surface of the seating portion 63.

When the thickness (A) from the portion where the control box 40 is coupled to the mount plate 50 to the back surface is larger than the distance (B) from the wall surface of the seating portion 63, the lower end of the display device 10 is projected more. When the thickness (A) is smaller than the distance (B), the upper end of the display device 10 is projected more.

At this time, a rubber 45 may be further provided in the back surface of the control box 40. The rubber 45 is a portion of the back surface composing the control box 40 that contacts with the wall, when the display device 10 is hung on the wall. If it were not for the rubber 45, the shock generated when the control box 40 is collided against with the wall while the display device 10 is mounted to the wall fails to be absorbed. The rubber 45 may be formed of a frictional rubber or silicon material. Even when the wall is not smooth, the rubber 45 can compensate a predetermined height from the wall.

As mentioned above, according to at least one embodiment of the present invention, an installation angle can be changed to make the display device leveled even after the mount device is installed. Accordingly, the difficulty in leveling the display device when it is mounted to the wall can be relieved.

Furthermore, the structure of the mount device can be simple and the number of the parts can be reduced. Accordingly, the installation process can be simple and the time taken to install the display device to the wall can be reduced.

When a particular feature, structure, or characteristic is described in connection with any embodiment, it is submitted that it is within the purview of one skilled in the art to affect such feature, structure, or characteristic in connection with other ones of the embodiments. Although embodiments have been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display module configured to display a screen;
   a case configured to mount the display module therein;

a mount plate coupled to a back surface of the case, with a lower portion including an arch-shaped handle having a predetermined curvature, wherein a center point for the predetermined curvature and the arch-shaped handle are included in a first virtual plane, and the first virtual plane is substantially parallel to a plane of the screen; and a mount fixer fixed to a wall, the mount fixer including;
- a seating portion having a same curvature as the handle;
- a rear bracket coupled to the wall;
- a front bracket coupled to a front surface of the rear bracket, with a lower end coupled to the rear bracket and an upper end spaced apart a predetermined distance from the rear bracket; and
- a top bracket slidably coupled to a top end of the rear bracket, the top bracket configured to slide toward the front bracket to cover an upper portion of the seating portion while the front bracket remains stationary.

2. The display device according to claim 1, wherein a length of the mount fixer is smaller than a length of the handle.

3. The display device according to claim 1, wherein the seating portion is formed in a gap between the front bracket and the rear bracket.

4. The display device according to claim 1, wherein the mount fixer further includes a frictional member provided in a front or rear portion of the seating portion to prevent the handle from slipping.

5. The display device according to claim 4, wherein a middle or lower portion of the frictional member is projected more than an upper portion.

6. The display device according to claim 1, wherein the case further includes a control box arranged on the back surface of the case, and wherein the mount plate is coupled to an upper end of the control box.

7. The display device according to claim 6, further including:
- a rubber provided on a back surface of the control box, the rubber configured to contact with the wall when the mount fixer and the mount plate are coupled to each other.

8. The display device according to claim 1, wherein the display module includes an organic light emitting diode (OLED).

* * * * *